(12) United States Patent
Huang

(10) Patent No.: US 6,756,684 B2
(45) Date of Patent: Jun. 29, 2004

(54) FLIP-CHIP BALL GRID ARRAY SEMICONDUCTOR PACKAGE WITH HEAT-DISSIPATING DEVICE AND METHOD FOR FABRICATING THE SAME

(75) Inventor: Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/192,399

(22) Filed: Jul. 10, 2002

(65) Prior Publication Data

US 2003/0146519 A1 Aug. 7, 2003

(30) Foreign Application Priority Data

Feb. 5, 2002 (TW) ........................................ 91101948 A

(51) Int. Cl.[7] .............................................. H01L 23/48
(52) U.S. Cl. ...................... 257/778; 257/723; 257/778; 257/781; 257/712; 257/717
(58) Field of Search .................................. 257/723, 778, 257/781, 712, 717; 324/765

(56) References Cited

U.S. PATENT DOCUMENTS 5,798,567 A * 8/1998 Kelly et al. .................. 257/723

6,590,409 B1 * 7/2003 Hsiung et al. .............. 324/765

\* cited by examiner

Primary Examiner—David Nelms
Assistant Examiner—Mai-Huong Tran
(74) Attorney, Agent, or Firm—Peter F. Corless; Steven M. Jensen; Edwards & Angell, LLP

(57) ABSTRACT

A FCBGA (flip-chip ball grid array) semiconductor package with a heat-dissipating device and a method for fabricating the same are provided. At least a chip is mounted on a substrate in a flip-chip manner, and connected to a heat-dissipating device that is composed of a heat sink and a plurality of thermally conductive bumps implanted on the beat sink. Heat produced from the chip is dissipated via the heat-dissipating device. The thermally conductive bumps are bonded to a circuit board, and thereby reduce contact area between the heat-dissipating device and the circuit board, without forming of voids or popcorn effect during a solder-reflow process. The heat sink in contact with the chip is similar in coefficient of thermal expansion (CTE) to the chip, so as to prevent delamination between the heat sink and the chip, thereby assuring quality and yield of fabricated package products.

11 Claims, 3 Drawing Sheets

FLIP-CHIP BALL GRID ARRAY SEMICONDUCTOR PACKAGE WITH HEAT-DISSIPATING DEVICE AND METHOD FOR FABRICATING THE SAME

FIELD OF THE INVENTION

The present invention relates to semiconductor packages and fabrication methods thereof, and more particularly, to a FCBGA (flip-chip ball grid array) semiconductor package with a heat-dissipating device and a method for fabricating the semiconductor package.

BACKGROUND OF THE INVENTION

FCBGA (flip-chip ball grid array) semiconductor packages are an advanced packaging technology, which is characterized by implanting a plurality of solder bumps on an active surface, a surface formed with electronic components, of a chip that is electrically connected to a substrate by bonding the solder bumps to the substrate. Compared to BGA semiconductor packages, flip-chip package structure is free of forming bonding wires for chip-to-substrate electrical connection; without having to fabricate bond fingers on a substrate for wire-bonding, thereby effectively reduce the package size.

With high-integration development of semiconductor packages and chips, it becomes a critical problem to efficiently dissipate heat produced by operation of the semiconductor packages and chips.

Therefore, as shown in FIG. 5, U.S. Pat. No. 5,798,567 disclose a FCBGA semiconductor package 1 mounted on a circuit board 10 such as a printed circuit board (PCB). This semiconductor package 1 is provided with a chip 12 mounted on a substrate 11 in a flip-chip manner, wherein the chip 12 is implanted with a plurality of first solder bumps 13, and electrically connected to the substrate 11 by bonding the first solder bumps 13 to the substrate 11. A plurality of second solder bumps 14 are implanted on the substrate 11, for allowing the semiconductor package 1 to be bonded to the circuit board 10 by means of the second solder bumps 14, wherein a conductive adhesive 15 is applied between the chip 12 and the circuit board 10, such that heat produced by operation of the chip 12 can be transmitted through the conductive adhesive 15 to the circuit board 10 for dissipation.

However, the above conventional semiconductor package 1 requires additional processes of surface mount technology (SMT) for applying the conductive adhesive 15 over the circuit board 10, thereby increasing process complexity and costs in package fabrication. Moreover, in practice, the conductive adhesive 15 is a perfect heat transmission material, and therefore not capable of optimally dissipating the heat produced from the chip 12.

Another FCBGA semiconductor package 1' is similar in structure to the above semiconductor package 1, and thereby also illustrated by FIG. 5. This semiconductor package 1' differs from the above semiconductor package 1 in that, a metallic heat sink 15' is used, instead of the conductive adhesive 15, for connecting the chip 12 to the circuit board 10, so as to allow the heat produced from the chip 12 to be transmitted through the heat sink 15' to the circuit board 10 for dissipation.

However, with the heat sink 15' being interposed between the chip 12 and the circuit board 10, during a solder-reflow process for bonding the heat sink 15' to the circuit board 10, the heat sink 15' of relatively large area would be unevenly heated, which possibly results in forming of voids or even popcorn effect, thereby adversely affect the quality of fabricated products. Moreover, due to mismatch in coefficient of thermal expansion (CTE) between the metallic heat sink 15' and the chip 12, delamination may undesirably occur at interface between the heat sink 15' and the chip 12, which would undesirably increase resistance of heat dissipation and degrade heat-dissipating efficiency, as well as reduced yield.

Therefore, the above drawbacks of a semiconductor package for assuring quality thereof and effectively dissipating heat produced thereby is a critical issue to solve.

SUMMARY OF THE INVENTION

An objective of the present invention is to provide a FCBGA (flip-chip ball grid array) semiconductor package with a heat-dissipating device and a method for fabricating the same, so as to effectively improve heat-dissipating efficiency of the semiconductor package.

Another objective of the present invention is to provide a FCBGA semiconductor package with a heat-dissipating device and a method for fabricating the same, without increasing process complexity of mounting the semiconductor package on a circuit board.

A further objective of the present invention is to provide a FCBGA semiconductor package with a heat-dissipating device and a method for fabricating the same, so as to prevent forming of voids or popcorn effect for the semiconductor package, thereby assuring quality of fabricated products.

A further objective of the present invention is to provide a FCBGA semiconductor package with a heat-dissipating device and a method for fabricating the same, so as to prevent delamination for the semiconductor package, thereby improving yield of fabricated products.

In accordance with the above and other objectives, the present invention proposes a FCBGA semiconductor package with a heat-dissipating device, and a method for fabricating the semiconductor package. The FCBGA semiconductor package comprises: a substrate having an upper surface and a lower surface opposed to the upper surface; at least one first chip mounted on and electrically connected to the upper surface of the substrate; at least one second chip mounted on the lower surface of the substrate in a flip chip manner, the second chip having an active surface and a non-active surface opposed to the active surface, allowing the second chip to be electrically connected to the substrate by bonding a plurality of first solder bumps to the active surface of the second chip and the lower surface of the substrate; a plurality of second solder bumps implanted on the lower surface of the substrate at an area exclusive of the second chip; a heat-dissipating device composed of a heat sink and a plurality of thermally conductive bumps, wherein the heat sink has an upper surface and a lower surface opposed to the upper surface, allowing the upper surface to be attached to the non-active surface of the second chip, and the thermally conductive bumps are implanted on the lower surface of the heat sink, and a circuit board for accommodating the thermally conductive bumps and the second solder bumps thereon in a manner that, the thermally conductive bumps are interposed between the heat sink and the circuit board, and the second solder bumps are interposed between the substrate and the circuit board.

The method for fabricating the above FCBGA semiconductor package comprises the steps of: preparing a substrate having an upper surface and a lower surface opposed to the upper surface; mounting at least one first chip on the upper surface of the substrate, allowing the first chip to be electrically connected to the substrate; mounting at least one second chip on the lower surface of the substrate in a flip chip manner, the second chip having an active surface and a non-active surface opposed to the active surface, allowing the second chip to be electrically connected to the substrate by bonding a plurality of first solder bumps to the active surface of the second chip and the lower surface of the substrate; implanting a plurality of second solder bumps on the lower surface of the substrate at an area exclusive of the second chip; preparing a heat-dissipating device composed of a heat sink and a plurality of thermally conductive bumps, wherein the heat sink has an upper surface and a lower surface opposed to the upper surface, allowing the upper surface to be attached to the non-active surface of the second chip, and the thermally conductive bumps are implanted on the lower surface of the heat sink; and providing a circuit board for accommodating the thermally conductive bumps and the second solder bumps thereon in a manner that, the thermally conductive bumps are interposed between the heat sink and the circuit board, and the second solder bumps are interposed between the substrate and the circuit board.

Combined thickness of the second chip, first solder bump, heat sink and thermally conductive bump is equal to and slightly smaller than height of the second solder bump. Therefore, bottoms of the thermally conductive bump and the second bond pads are coplanar to be bonded to the circuit board. The semiconductor package can operate with electrical connection to the circuit board via the second solder bumps. And, heat produced by operation of the semiconductor package can be transmitted through the heat-dissipating device (heat sink and thermally conductive bumps) to the circuit board, and dissipated to outside of the circuit board via the thermal pads and the thermal vias, thereby effectively improving heat-dissipating efficiency of the semiconductor package.

In another embodiment, the heat sink is formed with at least one protruding portion peripherally protruding from the upper surface of the heat sink toward the substrate to reach the lower surface of the substrate. With the protruding portion abutting against the substrate, heat produced from operation of the semiconductor package can be more efficiently transmitted through the heat sink and thermally conductive bumps to the circuit board for dissipation, thereby further improving heat-dissipating efficiency of the semiconductor package.

Besides improvement in heat-dissipating efficiency, the above semiconductor package can also provide other significant benefits by using a heat-dissipating device composed of a heat sink and a plurality of thermally conductive bumps, for eliminating drawbacks in the prior art through the use of a conductive adhesive with a heat sink. First, compared to the conventional conductive adhesive, combination of the heat sink and the thermally conductive bumps provides better heat-dissipating efficiency for the semiconductor package. And, the thermally conductive bumps and the second solder bumps are simultaneously mounted on the circuit board, without undesirably increasing process complexity of surface mount technology (SMT). Moreover, as contact area between the thermally conductive bumps and the circuit board is relatively small, forming of voids or popcorn effect caused by uneven heating to a conventional heat sink can be prevented during a solder-reflow process. In addition, the heat sink is made of a material similar in coefficient of thermal expansion (CTE) to the second chip, thereby eliminating problems of delamination between a conventional heat sink and a chip due to CTE mismatch. Therefore, quality and production yield of the semiconductor package can be well assured through the use of the heat-dissipating device.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1:
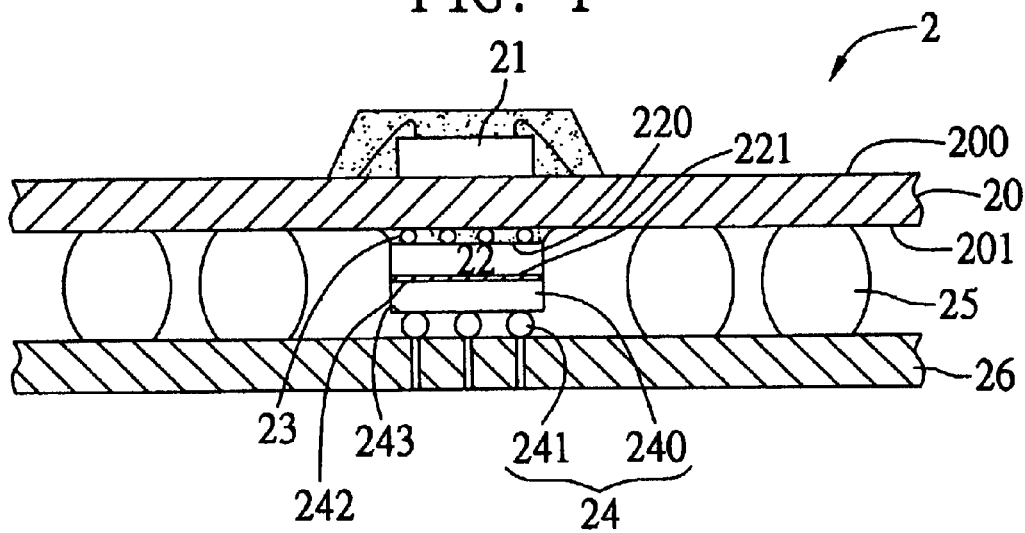
FIG. 1 is a cross-sectional view of a semiconductor package according to a first preferred embodiment of the invention.

FIG. 1 illustrates a semiconductor package 2 according to a first preferred embodiment of the present invention. As shown in FIG. 1, the semiconductor package 2 comprises: a substrate 20 having an upper surface 200 and a lower surface 201 opposed to the upper surface 200; at least one first chip 21 mounted on and electrically connected to the upper surface 200 of the substrate 20; at least one second chip 22 mounted on the lower surface 201 of the substrate 20 in a flip chip manner, the second chip 22 having an active surface 220 and a non-active surface 221 opposed to the active surface 220, allowing the second chip 22 to be electrically connected to the substrate 20 by bonding a plurality of first solder bumps 23 to the active surface 220 of the second chip 22 and the lower surface 201 of the substrate 20; a heat-dissipating device 24 composed of a heat sink 240 and a plurality of thermally conductive bumps 241, wherein the heat sink 240 has an upper surface 242 and a lower surface 243 opposed to the upper surface 242, allowing the upper surface 242 to be attached to the non-active surface 221 of the second chip 22, and the thermally conductive bumps 241 are implanted on the lower surface 243 of the heat sink 240; a plurality of second solder bumps 25 implanted on the lower surface 201 of the substrate 20 at an area exclusive of the second chip 22; and a circuit board 26 for accommodating the thermally conductive bumps 241 and the second solder bumps 25 thereon in a manner that, the thermally conductive bumps 24 are interposed between the heat sink 240 and the circuit board 26, and the second solder bumps 25 are interposed between the substrate 20 and the circuit board 26.

The above semiconductor package 2 can be fabricated by processes illustrated in FIGS. 2A to 2E.

Figure 2A:
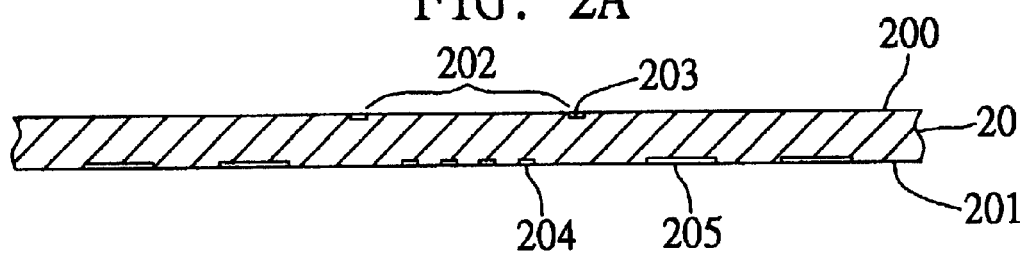
FIGS. 2A–2E are cross-sectional schematic diagrams showing process steps for fabricating the semiconductor package illustrated in FIG. 1.

Referring to FIG. 2A, the first step is to prepare a substrate 20 having an upper surface 200 and a lower surface 201 opposed to the upper surface 200. The upper surface 200 of the substrate 20 is formed with a chip attach area 202 and a plurality of bond fingers 203 surrounding the chip attach area 202. The lower surface 201 of the substrate 20 is formed with a plurality of first bond pads 204 in a predetermined area, and a plurality of second bond pads 205 outside the predetermined area. Since internal structure and circuitry of the substrate 20 are conventional in the art, they are not to be further detailed herein.

Figure 2B:
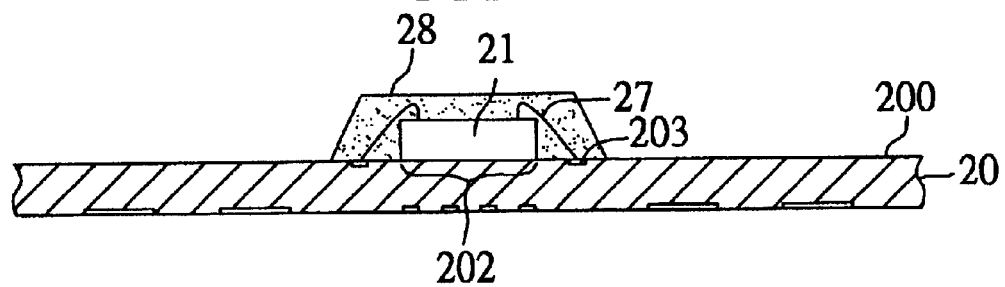

Referring to FIG. 2B, the next step is to mount at least one first chip 21 on the upper surface 200 of the substrate 20, and electrically connect the first chip 21 to the substrate 20 by a plurality of bonding wires 27 e.g. gold wires bonded to the bond fingers 203. An encapsulant 28 made of e.g. epoxy resin is formed on the upper surface 200 of the substrate 20, for encapsulating the first chip 21 and the bonding wires 27. Since forming of the bonding wires 27 and the encapsulant 28 employs conventional technology, it is not to be further described herein.

Figure 2C:
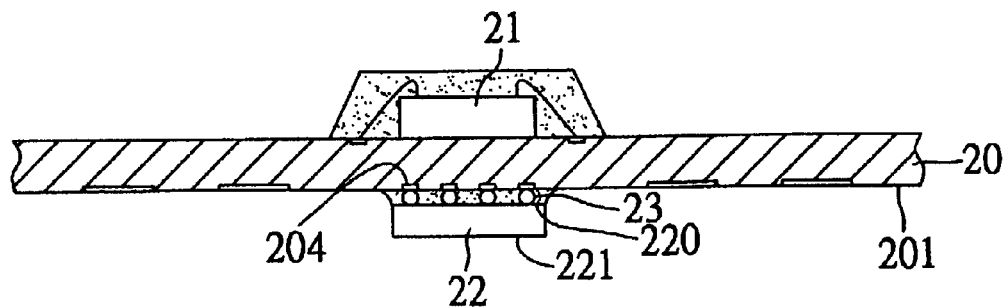

Then, referring to FIG. 2C, at least one second chip 22 is prepared, and has an active surface 220 and a non-active surface 221 opposed to the active surface 220. A plurality of first solder bumps 23 are implanted on the active surface 220 corresponding in position to the first bond pads 204 on the lower surface 201 of the substrate 20, and the second chip 22 is mounted on the lower surface 201 of the substrate 20 in a flip chip manner by bonding the first solder bumps 23 to the first bond pads 204 of the substrate 20, thereby making the second chip 22 electrically connected to the substrate 20 via the first solder bumps 23. An underfill process is performed to fill a resin compound e.g. epoxy resin into a gap between the second chip 22 and the substrate 20 for encapsulating the first solder bumps 23, so as to enhance bonding between the second chip 22 and the substrate 20.

Figure 2D:
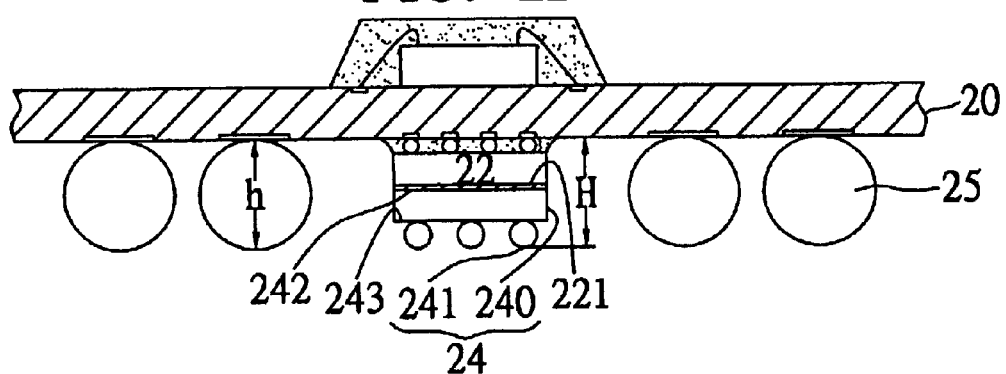

Referring to FIG. 2D, a plurality of second solder bumps 25 are bonded to the second bond pads 205 on the lower surface 201 of the substrate 20, for mediating electrical connection with an external device (not shown). Then, a heat-dissipating device 24 is prepared and composed of a heat sink 240 and a plurality of thermally conductive bumps 241, wherein the heat sink 240 has an upper surface 242 and a lower surface 243 opposed to the upper surface 242. The upper surface 242 of the heat sink 240 is attached to the non-active surface 221 of the second chip 22, and then, the thermally conductive bumps 241 are implanted on the lower surface 243 of the heat sink 240. Alternatively, the thermally conductive bumps 241 are first mounted on the lower surface 243 of the heat sink 240, and the upper surface 242 of the heat sink 240 is then attached to the non-active surface 221 of the second chip 22. Combined thickness H of the second chip 22, first solder bump 23, heat sink 240 and thermally conductive bump 241 is equal to or slightly smaller than height h of the second solder bump 25, preferably H=h. Therefore, bottoms of the thermally conductive bump 241 and the second bond pads 205 are coplanar to be bonded to an external device such as a printed circuit board (PCB, not shown).

Figure 2E:
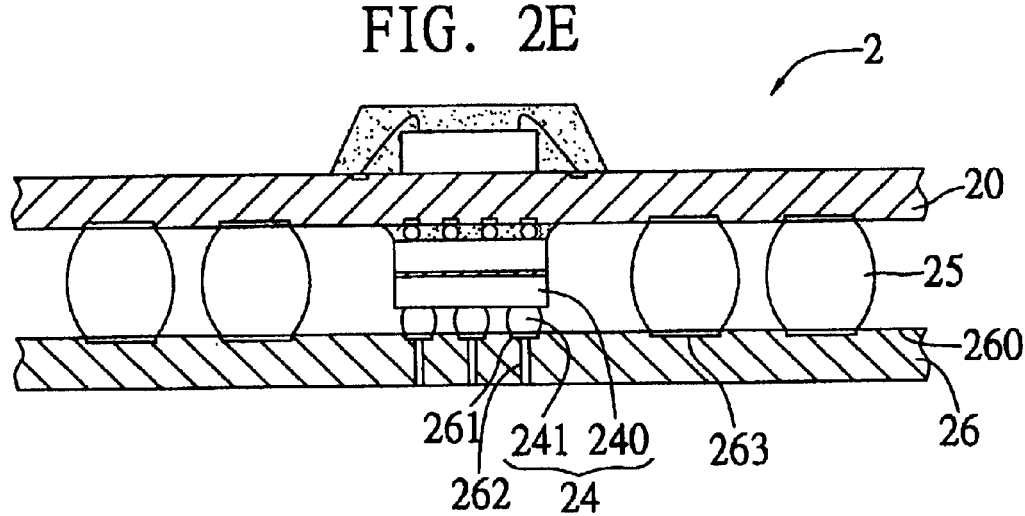

Finally, referring to FIG. 2E, a circuit board 26 e.g. a PCB is prepared, and formed on a surface 260 thereof with a plurality of thermal pads 261 corresponding in position to the thermally conductive bumps 241, and a plurality of connecting pads 263 corresponding in position to the second solder bumps 25, wherein a plurality of thermal vias 262 penetrating through the circuit board 26 are connected to the thermal pads 261. Since internal structural arrangement of the circuit board 26 is conventional in the art, it is not to be further detailed herein. The thermally conductive bumps 241 and the second solder bumps 25 of the semiconductor package 2 are respectively bonded to the thermal pads 261 and the connecting pads 263 of the circuit board 26 in a manner that, the thermally conductive bumps 24 are interposed between the heat sink 240 and the circuit board 26, and the second solder bumps 25 are interposed between the substrate 20 and the circuit board 26; then, a solder-reflow process is performed to secure bonding between the circuit board 26 and the thermally conductive bumps 241 or second solder bumps 25. As the solder-reflow process is conventional technology, it is not to be further described herein. Therefore, the semiconductor package 2 can operate with electrical connection to the circuit board 26 via the second solder bumps 25. And, heat produced by operation of the semiconductor package 2 can be transmitted through the heat-dissipating device 24 (heat sink 24 and thermally conductive bumps 241) to the circuit board 26, and dissipated to outside of the circuit board 26 via the thermal pads 261 and the thermal vias 262, thereby effectively improving heat-dissipating efficiency of the semiconductor package 2.

Various Embodiments of Heat-Dissipating Device

Figure 3A:
FIGS. 3A–3C are cross-sectional views of various embodiments of a heat-dissipating device used in the semiconductor package illustrated in FIG. 1.
Figure 3B:
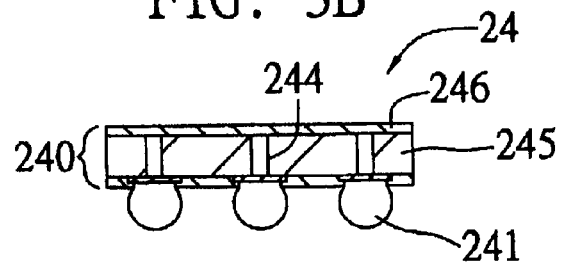
Figure 3C:
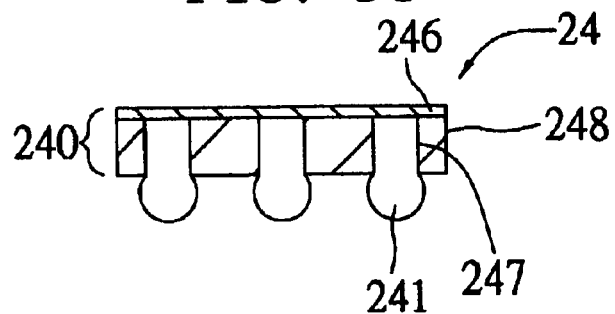

FIGS. 3A–3C illustrate various embodiments of a heat-dissipating device 24 used in the semiconductor package 2. The heat-dissipating device 24 is composed of a heat sink 24 and a plurality of thermally conductive bumps 241.

As shown in FIG. 3A, the heat sink 240 is made of silicon, and bonded with the thermally conductive bumps 241 by a under bump metallurgy (UBM) process. As this UBM process is conventional technology, it is not to be further described herein.

As shown in FIG. 3B, the heat sink 240 comprises a BT (bismaleimide triazine) resin layer 245 formed with a plurality of electrically and thermally conductive vias 244, and a copper layer 246 formed over a surface of the BT resin layer 245. The thermally conductive bumps 241 are implanted on an opposed surface of the BT resin layer 245 and connected to the conductive vias 244, allowing the copper layer 246 to be in electrical and thermal connection to the thermally conductive bumps 241 via the conductive vias 244.

As shown in FIG. 3C, the heat sink 240 comprises a polyimide tape 248 formed with a plurality of through holes 247, and a copper layer 246 formed over a surface of the polyimide tape 248, allowing the thermally conductive bumps 241 to be implanted on an opposed surface of the polyimide tape 248 and connected to the copper layer 246 via the through holes 247.

The above heat sink 240 is made of a material similar in coefficient of thermal expansion (CTE) to a chip; therefore, the heat sink 240 would be firmly bonded with the second chip 22 without being easily delaminated by CTE mismatch. It should be understood that, the heat-dissipating device 24 is not limited to the above embodiments, and other modifications in structure and materials are also pertained to the scope of the invention.

Second Preferred Embodiment

Figure 4:
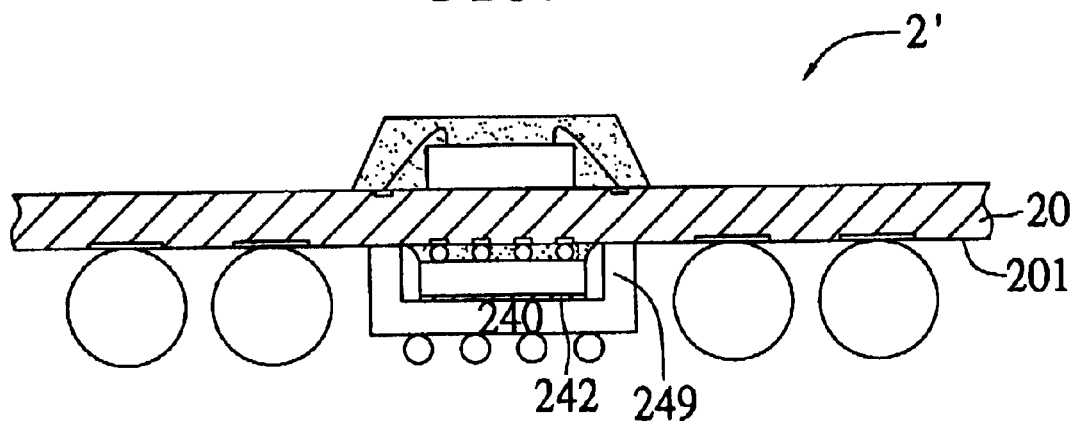
FIG. 4 is a cross-sectional view of a semiconductor package according to a second preferred embodiment of the invention.
Figure 5:
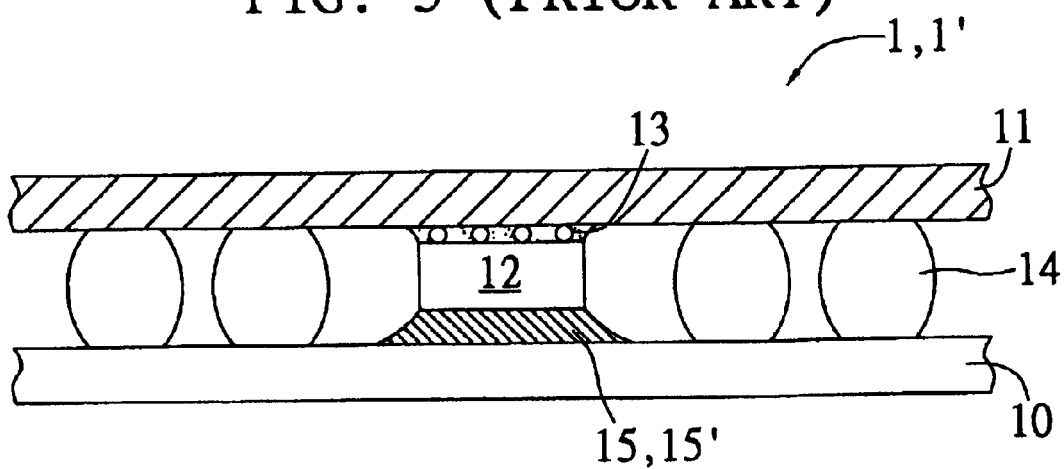
FIG. 5 (PRIOR ART) is a cross-sectional view of a conventional semiconductor package.

FIG. 4 illustrates a semiconductor package 2' according to a second preferred embodiment of the invention. As shown in FIG. 4, the semiconductor package 2' of this second embodiment is primarily the same in structure as the semiconductor package 2 of the first embodiment, except for a heat sink 240 of the semiconductor package 2'. This heat sink 240 is further formed with at least one protruding portion 249 that peripherally protrudes from an upper surface 242 thereof attached to a second chip 22 and extends to reach a lower surface 201 of a substrate 20. With the protruding portion 249 abutting against the substrate 20, heat produced from operation of the semiconductor package 2' can be more efficiently transmitted through the heat sink 240 and thermally conductive bumps 241 to an external circuit board (not shown) for dissipation, thereby further improving heat-dissipating efficiency of the semiconductor package 2'.

In conclusion from the above preferred embodiments, besides improvement in heat-dissipating efficiency, the above semiconductor package 2, 2' can also provide other significant benefits by using a heat-dissipating device 24 composed of a heat sink 240 and a plurality of thermally conductive bumps 241, for eliminating drawbacks in the prior art through the use of a conductive adhesive with a heat sink. First, compared to the conventional conductive adhesive, combination of the heat sink 240 and the thermally conductive bumps 241 provides better heat-dissipating efficiency for the semiconductor package 2, 2'. And, the thermally conductive bumps 241 and the second solder bumps 25 are simultaneously mounted on the circuit board 26, without undesirably increasing process complexity of surface mount technology (SMT). Moreover, as contact area between the thermally conductive bumps 241 and the circuit board 26 is relatively small, forming of voids or popcorn effect caused by uneven heating to a conventional heat sink can be prevented during a solder-reflow process. In addition, the heat sink 240 is made of a material similar in CTE to the second chip 22, thereby eliminating problems of delamination between a conventional heat sink and a chip due to CTE mismatch. Therefore, quality and production yield of the semiconductor package 2, 2' can be well assured through the use of the heat-dissipating device 24.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A FCBGA (flip-chip ball grid array) semiconductor package with a heat-dissipating device, the FCBGA semiconductor package comprising:

a substrate having an upper surface and a lower surface opposed to the upper surface;

at least one first chip mounted on and electrically connected to the upper surface of the substrate;

at least one second chip mounted on the lower surface of the substrate in a flip chip manner, the second chip having an active surface and a non-active surface opposed to the active surface, allowing the second chip to be electrically connected to the substrate by bonding a plurality of first conductive elements to the active surface of the second chip and the lower surface of the substrate;

a plurality of second conductive elements implanted on the lower surface of the substrate at an area exclusive of the second chip; and a heat-dissipating device composed of a heat sink and a plurality of thermally conductive bumps, wherein the heat sink has an upper surface and a lower surface opposed to the upper surface, allowing the upper surface to be attached to the non-active surface of the second chip, and the thermally conductive bumps are implanted on the lower surface of the heat sink.

2. The FCBGA semiconductor package of claim 1, wherein the first chip is electrically connected to the substrate by a plurality of bonding wires, and the first chip and the bonding wires are encapsulated by an encapsulant formed on the upper surface of the substrate.

3. The FCBGA semiconductor package of claim 1, wherein the first conductive elements between the second chip and the substrate are encapsulated by underfill technology.

4. The FCBGA semiconductor package of claim 1, wherein the thermally conductive bumps and the second conductive elements are simultaneously mounted on a circuit board that is formed with a plurality of thermal vias connected to the thermally conductive bumps in a manner that, the thermally conductive bumps are interposed between the heat sink and the circuit board, and the second conductive elements are interposed between the substrate and the circuit board.

5. The FCBGA semiconductor package of claim 1, wherein combined thickness of the second chip, first conductive element, heat sink and thermally conductive bump is equal to height of the second conductive element.

6. The FCBGA semiconductor package of claim 1, wherein combined thickness of the second chip, first conductive element, heat sink and thermally conductive bump is smaller than height of the second conductive element.

7. The FCBGA semiconductor package of claim 1, wherein the heat sink is made of silicon.

8. The FCBGA semiconductor package of claim 1, wherein the heat sink comprises a BT (bismaleimide triazine) resin layer formed with a plurality of vias 244, and a copper layer formed over a surface of the BT resin layer, allowing the thermally conductive bumps to be implanted on an opposed surface of the BT resin layer and connected to the vias.

9. The FCBGA semiconductor package of claim 1, wherein the heat sink comprises a polyimide tape formed with a plurality of through holes, and a copper layer formed over a surface of the polyimide tape, allowing the thermally conductive bumps to be implanted on an opposed surface of the polyimide tape and connected to the copper layer via the through holes.

10. The FCBGA semiconductor package of claim 1, wherein the heat sink is formed with at least one protruding portion peripherally protruding from the upper surface of the heat sink toward the substrate to reach the lower surface of the substrate.

11. The FCBGA semiconductor package of claim 1, wherein the first and second conductive elements are solder bumps.

* * * * *